United States Patent
Bugeja et al.

(10) Patent No.: US 6,424,283 B2
(45) Date of Patent: Jul. 23, 2002

(54) SEGMENTED HIGH SPEED AND HIGH RESOLUTION DIGITAL-TO-ANALOG CONVERTER

(75) Inventors: Alexander Bugeja, Dallas; Ching-yuh Tsay; Irfan A. Chaudhry, both of Plano; Mounir Fares, Richardson, all of TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/904,990

(22) Filed: Jul. 13, 2001

Related U.S. Application Data

(60) Provisional application No. 60/219,562, filed on Jul. 20, 2000.

(51) Int. Cl.[7] .................................................. H03M 1/68
(52) U.S. Cl. ............................................................ 341/145
(58) Field of Search ......................... 341/145, 50, 133, 341/136, 144, 153

(56) References Cited

U.S. PATENT DOCUMENTS 5,640,162 A * 6/1997 Lewyn ........................ 341/144
6,163,283 A * 12/2000 Schofield .................... 341/144

* cited by examiner

*Primary Examiner*—Brian Young
(74) *Attorney, Agent, or Firm*—Alan K. Stewart; Wade James Brady, III; Frederick J. Telecky, Jr.

(57) ABSTRACT

A segmented digital-to-analog converter includes: upper segments 200, 210, and 220; a thermometer decoder 400; a randomizing circuit 410 coupled between the thermometer decoder 400 and the upper segments 200, 210, and 220 for randomizing an output of the thermometer decoder 400; a divider location selector circuit 420 coupled between the randomizing circuit 410 and the upper segments 200, 210, and 220 for choosing a selected segment from the upper segments 200, 210, and 220; and lower segments 225 coupled to the selected segment.

12 Claims, 3 Drawing Sheets

SEGMENTED HIGH SPEED AND HIGH RESOLUTION DIGITAL-TO-ANALOG CONVERTER

This application claims priority under 35 USC § 119 (e)(1) of provisional application No. 60/219,562 filed Jul. 20, 2000.

FIELD OF THE INVENTION

This invention generally relates to electronic systems and in particular it relates to digital-to-analog converters.

BACKGROUND OF THE INVENTION

Segmented DACs offer a good compromise between attaining the conflicting goals of high speed and high resolution in modern Nyquist rate DAC applications. The segmented architecture involves the use of thermometer decoded upper segments and thermometer/binary decoded lower segments which are typically derived by a divider circuit driven by a segment identical to the upper segments. The thermometer decoding of the upper and some/all of the lower segments avoids the static and dynamic problems associated with fully binary-weighted implementations due to the large major carry transitions. It is, however, impractical to implement the entire DAC in straight thermometer format with $2^n$ unit elements for n input bits, since of high resolution DACs n is large and the unit elements would number several thousand. The segmented architecture is a compromise between the full binary-weighted architecture and the full thermometer architecture.

Unfortunately the limitations of matching of integrated circuit components limit the static and dynamic accuracy and performance of any DAC, including segmented DACs if no further steps are taken to correct this problem. The inherent matching of components such as MOSFETS, resistors, bipolar transistors, etc., is typically observed to be on the 10-bit level; this creates static nonlinearities and tones in the spectral response of DACs created with such components. In the literature and prior art, a large number of solutions involving trimming, tuning, calibration and similar techniques have been proposed and implemented with regard to this problem. In general, one shortcoming of such techniques is that they offer at most a solution to the static aspect of the problem, in that after the trimming, tuning, calibration, etc., is complete, the unit elements of the DACs are matched at dc or low frequency but not necessarily at higher frequencies. It would be advantageous if the matching would be retained at higher frequencies also. Furthermore, the implementation of these techniques is often complex from the circuit, layout and processing viewpoints. For example, trimming requires increased fabrication complexity and costs due to the need of trimming operations on the wafer, whilst calibration schemes usually involve the addition of some form of storage circuitry onto each unit element being calibrated to store the calibration value.

The solution to these problems should possess the additional feature that it should be able to run in background during the circuit's normal operation, continuously monitoring the unit element values and correcting them as required. This is desirable to compensate for factors which change over time in integrated circuits, such as temperature and aging/drift processes. Not all the schemes mentioned possess this feature. For example, trimming is a once-only operation which cannot be repeated during normal operation. Similarly, various forms of calibration run in the chip's foreground and interfere with normal operation, so in applications where this is not acceptable, they can only be run once at power-up.

"A Noise-Shaping Coder Topology for 15+Bit Converters" by L. R. Carley, IEEE Journal of Solid-State Circuits, Volume 24, No. 2, pages 267–273, April 1989, describes a thermometer decoded DAC which uses dynamic element matching (DEM) to randomize the selection order of the thermometer decoded elements, hence restoring linearity both at low and high frequencies. The DAC is not, however, segmented and is suitable only for applications requiring a small number of equally-weighted elements, such as the multibit quantizers used in sigma-delta converter loops. The application of DEM to segmented DACs involves several problems related to mismatch between the upper and lower banks of segments.

To date, DEM has not been used in mainstream Nyquist rate DACs for this reason.

Adams (U.S. Pat. No. 5,977,899) describes a scheme applicable to multibit loop quantizer DACs used for example in sigma-delta feedback loops. The scheme uses DEM again, and also a simple segmented architecture with thermometer decoded upper segments and thermometer decoded lower segments, but relies on noise-shaping to remove the mismatch introduced between these two banks of segments. Such a scheme is only applicable in an oversampling environment, not a Nyquist-rate application. Furthermore, application of DEM to the lower segments is straightforward only if these segments are also thermometer decoded, which is not the case in general.

Much work has been done on attempts to obtain matching of the DAC elements from interdigitation-based layout of integrated circuit components. Relevant prior art is Mahant-Shetti et al. (U.S. Pat. No. 5,892,471), Tesch et al. (U.S. Pat. No. 5,949,362), and Reynolds (U.S. Pat. No. 5,568,145). In general these works exhibit linearity falling short of the very high accuracy required for modern applications (14bits+). "A 14 b 150 Msample/s Update Rate $Q^2$ Random Walk CMOS DAC" by J. Vandenbussche et al., International Solid-State Circuits Conference 1999, Digest of Technical Papers, IEEE International, pages 146–147 describes a chip which exhibits such linearity statically, but poor dynamic performance. One contributor to this poor dynamic performance is the large area required for such techniques, which increases parasitics. The large area itself is also inherently undesirable for cost reasons.

Fairchild et al. (U.S. Pat. No. 5,153,592), Smith et al. (U.S. Pat. No. 5,451,946), and Brooks (U.S. Pat. No. 5,446,455) describe schemes which involve measuring the output signal of DACs and compensating them internally accordingly. Such schemes may be applied to most DACs including high speed/precision segmented DACs, but are inherently foreground techniques unless two complete DACs are integrated side-by-side. Furthermore, they offer only a static solution.

Several DACs are based on self-calibrating or error-compensating techniques. Relevant prior art is Gersbach (U.S. Pat. No. 5,642,116), Gersbach (U.S. Pat. No. 5,666,118), Boyacigiller et al. (U.S. Pat. No. 4,465,996), Takeshi et al. (U.S. Pat. No. 5,198,814), Gleim (U.S. Pat. No. 5,270,716), and Hanna (U.S. Pat. No. 5,955,980). These techniques, however, involve complex additional circuitry and offer only static solutions, as is characteristic of calibration schemes, although some may be adapted to run in background.

A general representation of the prior art in segmented DACs is shown in FIG. 1, for the particular case of a current mode DAC where the unit elements are current sources. Those skilled in the art will be very familiar with the circuit architecture shown in this representation. The segmentation is done into a number of upper segments or most significant bits (MSBs) MSB 1 (10), MSB 2 (20) . . . MSB 2 (30), and a number of lower segments 50, 60, and 70, which are derived by dividing a current from an LSB driver current source 40. The prior art thermometer decoder 90 shown in FIG. 2 is used to drive the MSBs of FIG. 1; it does this by creating a thermometer code vector from the n upper bits of the digital input of the DAC which are input to the thermometer decoder 90 on input line 80. The output lines 100, 110, and 120 drives the MSBs 10, 20, and 30 of FIG. 1. Each bit position in this vector corresponds directly to one of the MSB current sources. The lower segments are shown as current sources for convenience, but in actual fact the total current is set by the LSB driver 40 and their function is solely to divide it into least significant bit representations. The implementation of the lower segments could be either thermometer and/or binary-weighted; it is typically a combination of both in high resolution applications, with the lowermost of the lower segments being binary weighted. The LSB Driver 40 is actually optional in the sense that the current sources 50, 60, and 70 could be employed as actual current sources with their tails connected at ground with the appropriate circuit modifications. However, using an LSB Driver is convenient because then it can be treated as an additional $2^n$ MSB for matching purposes. In FIG. 1 the matching requirement is satisfied if all the MSBs as well as the LSB driver are somehow trimmed or calibrated to give the same current value. It is assumed that the matching of the lower segment divider is derived from the inherent component matching of the process used; this is satisfied by allocating no more bits to the lower segments than the inherent component matching of the process can handle (usually 9 or 10 bits). Depending on the implementation, the circuit and method used to equalize the current values can be complex, require a considerable amount of additional circuitry, and possibly require foreground/power-up operation. Finally, only static matching is possible from such trimmed or calibrated architectures. Dynamic performance is not matched in any way except from a best-effort basis in the layout.

SUMMARY OF THE INVENTION

Generally, and in one form of the invention, the segmented digital-to-analog converter includes: upper segments; a thermometer decoder; a randomizing circuit coupled between the thermometer decoder and the upper segments for randomizing an output of the thermometer decoder; a divider location selector circuit coupled between the randomizing circuit and the upper segments for choosing a selected segment from the upper segments; and lower segments coupled to the selected segment.

DESCRIPTION OF PREFERRED EMBODIMENTS

Figure 1:
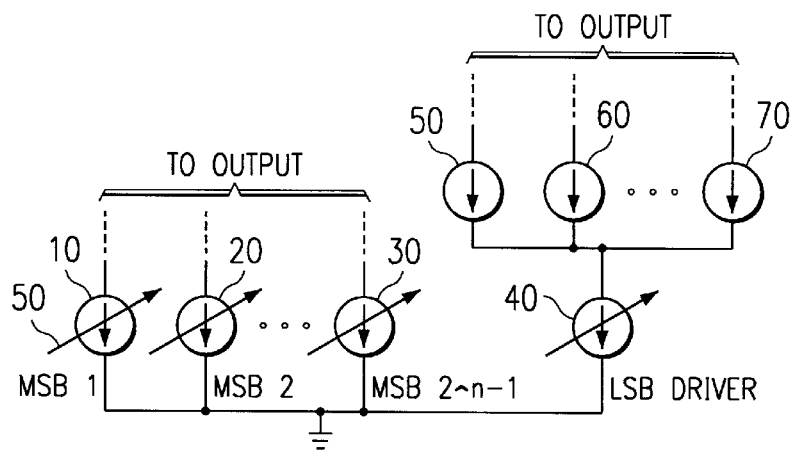
FIGS. 1 and 2 are a schematic circuit diagram of a prior art current mode segmented DAC.
Figure 2:
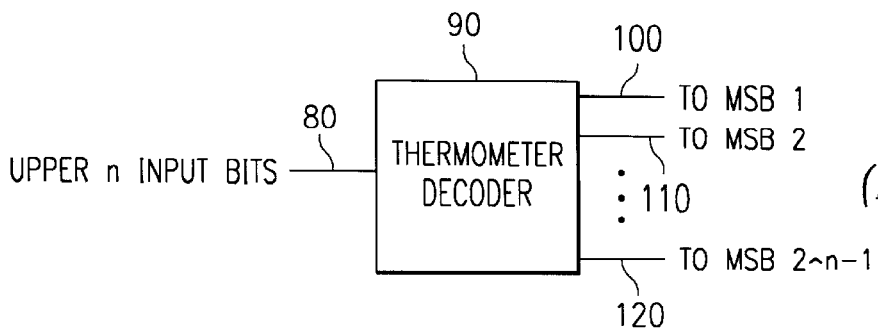

The preferred embodiment solution to the implementation of high speed and precision segmented DACs is one that allows for full static matching of all current sources, including handling the gain mismatch between the upper segments and the sum of the lower segments. Dynamic matching, i.e., matching extending into the high frequency range rather than just at lower frequencies and dc is also provided. Finally, the solution is simple to implement such that it can be coupled into existing DAC designs without too much circuit modification or extra circuitry. Additional circuitry is obviously undesirable from the area and parasitic viewpoints.

The preferred embodiment concerns the implementation of segmented high speed and high resolution digital-to-analog converters (DACs) in such a way that the upper thermometer-decoded segments are matched statically and dynamically using dynamic-element matching techniques, and the sum of the lower thermometer/binary decoded segments is matched statically to the average of the upper segments using current measurement and current trimming/correction techniques.

The preferred embodiment scheme involves the application of a combination of DEM techniques and current measurement/correction techniques. DEM is desirable as a technique because it improves both static and dynamic matching of the unit elements it is applied to. Typically in segmented DACs these unit elements are current sources and associated differential switches. Application of DEM to thermometer-coded current source elements results in the matching of these elements with respect to each other, not only at dc and low frequencies, but to a large extent at high frequencies also. This is because if the current sources are scrambled at high frequency (the DAC clock rate), the associated dynamic mismatches between current sources such as unequal path delay in the switch signal routing, unequal switch sizes, etc., are also scrambled. These factors do not affect the static linearity, but they have a strong impact on the dynamic (spectral) performance.

Unfortunately, DEM is problematic to apply in segmented implementations, although those skilled in the art will readily recognize that it is easily applicable to non-segmented DAC circuits such as those found in multibit quantizers in sigma-delta converters. The reason concerns the matching of the upper segments to the sum of the lower segments. As will be described, mismatch here will cause static and dynamic nonlinearities which will dominate the benefits obtained from applying the DEM purely to the upper segments. Some means must be found of integrating the lower segments in the entire scheme. A way of doing this purely with DEM is first described. An alternative embodiment is then described which applies DEM to the upper segments, and employs the use of a special circuit architecture which measures the average current so produced by the upper segments and forces it back into the lower segments by means of a current copying technique. The current copying technique itself is well known and described in the art (e.g. ref: "Codec for Echo-Canceling, Full-Rate ADSL Modems" by R. Hester et al., International Solid-State Circuits Conference, 1999, Digest of Technical Papers, IEEE International, pages 242–243). The resulting circuit therefore has upper segments which are matched to each other statically and dynamically, as well as lower segments which are statically matched in total to the average of the upper segments. The reasons for not matching the lower segments to the upper segments using DEM is explained below.

The circuit architecture is described with particular reference to the example of current-mode segmented DACs, i.e., those in which the unit elements are current sources. This is so because high performance DACs today use current source elements almost exclusively. Those skilled in the art, however, will readily recognize that the proposed circuit architecture is applicable in any segmented DAC where a need exists to match the upper segments to the lower ones, whether the DAC is a voltage-, current-, or charge-based implementation. It can also be applied to DACs utilizing a combination of these implementations, for example, voltage-based upper segments and charge-based lower segments, as in the case of RC-type DACs.

Figure 3:
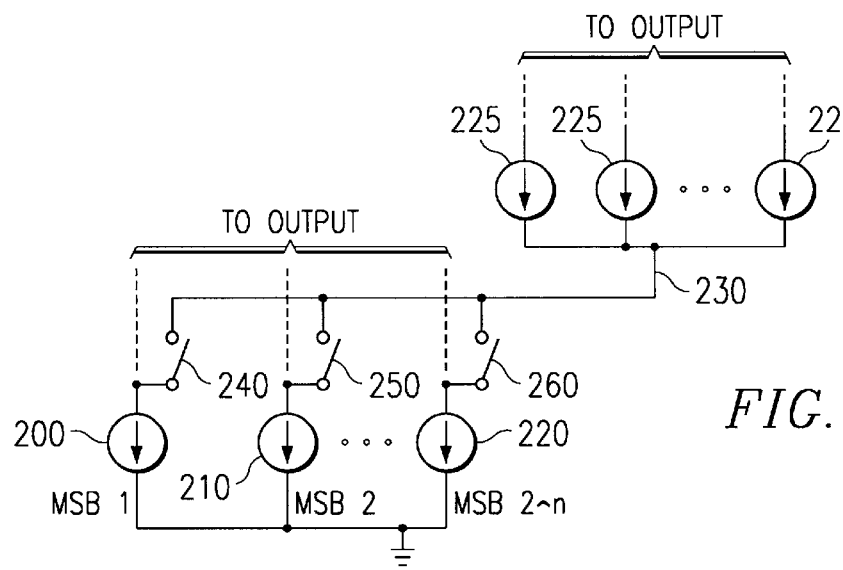
FIGS. 3 and 4 are a schematic circuit diagram of a preferred embodiment DEM implementation in a segmented DAC.

A preferred embodiment DEM implementation in a segmented DAC environment is shown in FIG. 3. An extra MSB current source 220 is added to the upper segment bank 200, 210, and 220, and there is no dedicated current source driving the LSBs 225. The thermometer decoder 400, shown in FIG. 4, driving the MSBs 200, 210, and 220 is scrambled in random fashion by a randomizing circuit 410 (n-way DEM scramble), in accordance with DEM principles which will be well familiar to those skilled in the art. The upper n input bits of the digital signal are input into the thermometer decoder 400 at input 300. There are only n-1 thermometer code outputs 320, but there are n scrambled outputs 340. The additional output can be obtained by inserting an arbitrary bit (say, 1 or 0) into the input side of the randomizing circuit 410. This is convenient for two reasons. First, most randomizing circuit designs are based on power-of-two architectures, and are not readily adapted to odd numbers of inputs. Second, an additional bit position is required to denote the location of the divider circuit. This second point is explained in more detail below.

As FIG. 3 shows, the divider circuit 225 may be driven by any of the upper MSB segments 200, 210, and 220 by means of the multiplexing switch array 240, 250, and 260, which connects any of the MSBs 200, 210, and 220(one at a time) to the common node 230. The divider location selector 420 is responsible for randomly or deterministically (say in sequential/cyclical fashion) selecting an MSB from the scrambled outputs 340 of the randomizing circuit. After the MSB responsible for driving the divider is selected, the remaining scrambled outputs 340 are allocated to the remaining MSBs in the normal DEM fashion on outputs 360. An additional MSB is present to allow for this, so that the number of MSB current sources is now $2^n$, not $2^{n-1}$, as shown in FIG. 3.

The implementation of the divider location selector circuit 420 is straightforward if the additional bit introduced into the input side of the randomizing circuit 410 is tracked as it passes through the circuit. For example, if the randomizing circuit 410 is a butterfly network controlled by a pseudo-random number generator, the divider location selector 420 can simply be a replica butterfly network controlled by the same code and fed the same arbitrary bit at the same input as the butterfly network of the randomizing circuit.

Figure 4:
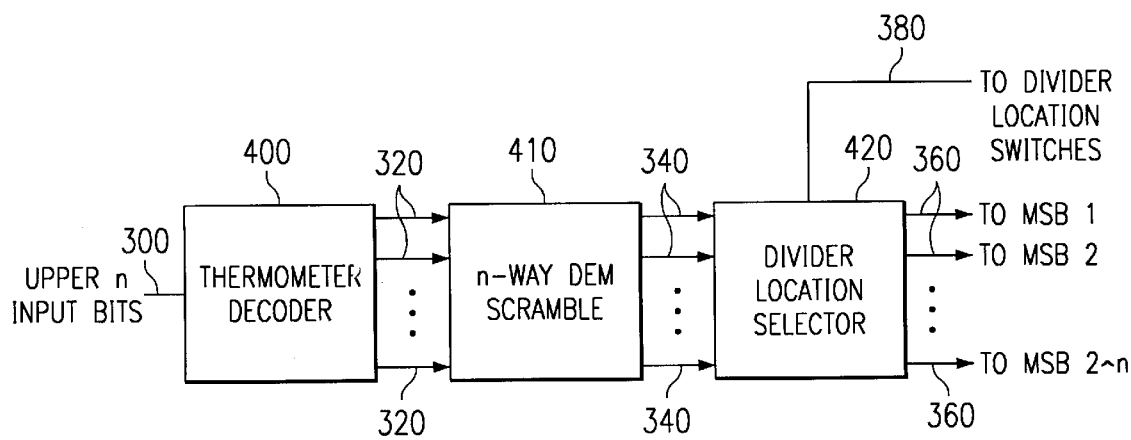

The circuit of FIGS. 3 and 4 attains the goal of integrating the lower segments into the DEM scheme. Since the LSBs 225 are driven by all the MSBs 200, 210, and 220 in random fashion, and since the DEM is applied to all $2^n$ MSBs, the upper segments are matched not only to each other but also to the sum of the lower segments. The accuracy of the current division of the lower segments is of course still dependent on the component matching of the divider (in theory, DEM can be applied at this level too, however, as can calibration and trimming schemes, etc.), but the DEM guarantees that they add up to the correct number, which is the average of the output currents of the $2^n$ MSBs, henceforth denoted as $I_{MEAN}$.

Figure 5:
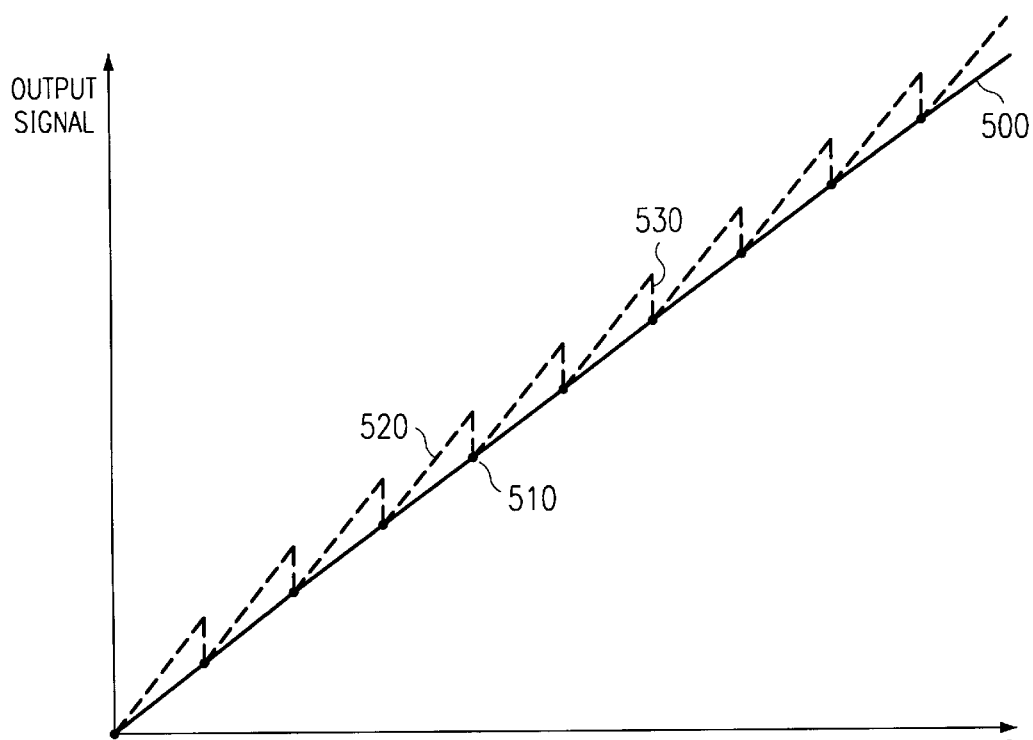
FIG. 5 is a plot of the output signal against the input word for a segmented DAC architecture in the matched and unmatched case.

The importance of minimizing the gain mismatch between the upper segments and the sum of the lower segments is shown in FIG. 5, which plots the output signal against the input word for a segmented DAC architecture in the matched and unmatched case. If the upper and lower segments are matched then the ideal straight line 500 results. The dots 510 on this line denote the major carry positions, when all the lower segments are turned off and only the upper ones are on. (In a differential implementation, the words "off" and "on" here may be arbitrarily taken to refer to either the plus or minus side of the implementation respectively).

The ideal straight line requires perfect matching of all the upper segments to each other as well as to the sum of the lower segments. In practice a straight line is never obtained since the matching is not perfect, but it is required that the line has an INL/DNL characteristic of <0.5 LSB units, i.e., the linearity should be sufficient for the resolution required. If DEM is applied only to the upper segments and no effort is made to match them to the lower segment except relying on the process matching, the dashed characteristic 520 results, with large steps 530 at the major carries causing large INL and DNL steps. The reason is that when the sum of the LSBs are turned off and an MSB switched on, the change in the output value should be a single LSB step, but it will be larger than that if the process matching is not sufficient for the resolution of the intended application (which defines the size of an LSB step). For example, if the process matching is 9–10 bit, the step could easily be >10 LSB units in a 14 bit application. This is obviously unacceptable. The static nonlinearities will also be reflected in the spectral response as harmonic tones, since good dynamic performance requires matching to be retained at high frequencies.

In high speed applications the circuit of FIGS. 3 and 4 may be impractical to implement. The lower segment divider 225 has to be switched amongst the MSBs at the DEM speed, but the switching is done at a slow node 230 which settles with. a very long time constant. In high speed and precision applications, specifically where the time constant is comparable to the clock rate within the precision of the application, this may result in the current output from the upper segments being different than the total current of the lower segments, due to the current of the segment driving the divider being deviated away from the divider to charge up the capacitance at this node with the time constant referred to. This therefore causes gain mismatch as in FIG. 5 once again. The gain mismatch is not observed only if the clock rate is so low as to make the time constant negligible within the constraints of the resolution required.

Figure 6:
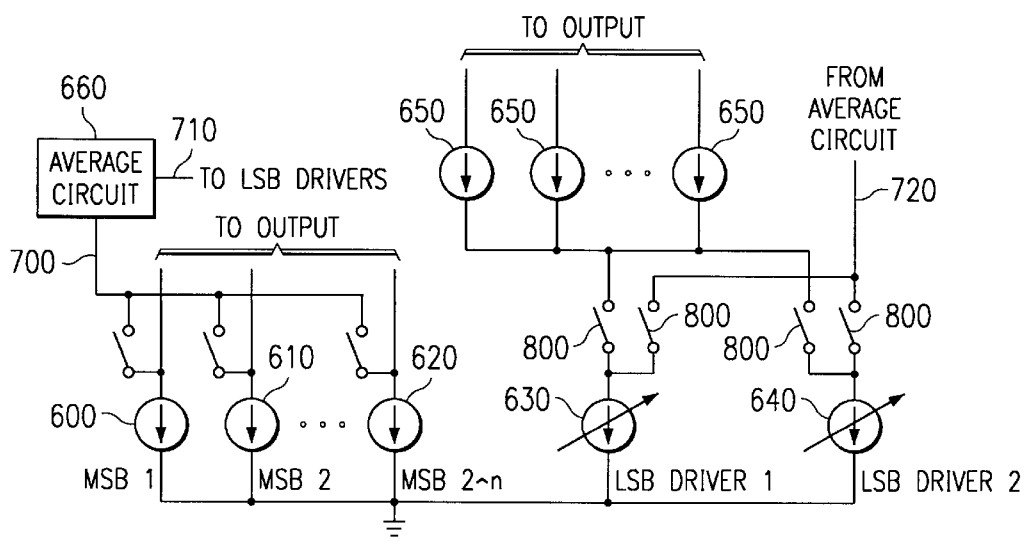
FIGS. 6 and 7 are a schematic circuit diagram of an alternative embodiment DEM implementation in a segmented DAC.
Figure 7:
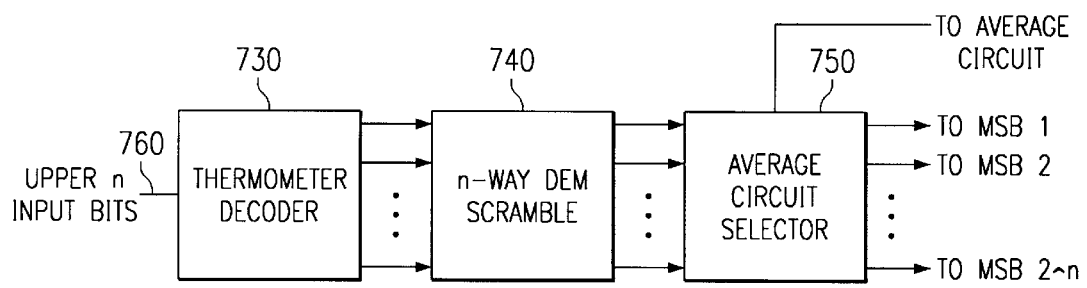

A solution which works around this is now described. An alternative embodiment hybrid implementation which applies DEM to the upper segments and statically matches the lower segments to their average current is shown in FIGS. 6 and 7. Again, $2^n$ MSB current sources 600, 610, and 620 are used, but their outputs are never switched to the lower segment divider 650. Instead, they are taken offline one at a time to be connected to an averaging circuit 660 through line 700. The process of doing this is, however, controlled in a similar fashion as was the process of controlling which MSB current source got to be selected for driving the lower segment divider in FIGS. 3 and 4, so the circuit of FIG. 7 is identical with the circuit of FIG. 4 except that the block 750. is now designated an "average circuit selector" rather than a "divider location selector". Thermometer decoders 730 and 400 are the same, scramble circuits 740 and 410 are the same, and inputs 760 and 300 are the same. The MSBs which are not connected to the averaging circuit (those still online) are used as DEM matched MSBs in the same way.

Two LSB Drivers 630 and 640 are present. A multiplexing switch bank 800 is used to control which drives the lower segment divider and which is connected at 720 to an additional output 710 of the averaging circuit. This additional output of the averaging circuit replicates the average current of the MSB current sources and copies it to the LSB Drivers one at a time. Methods of implementing the "current copying" will be familiar to those skilled in the art, for example, as described in Hester et al. (ISSCC99) and "A Self-Calibration Technique for Monolithic High-Resolution D/A Converters" by Groeneveld et al., IEEE Journal of Solid-State Circuits, Volume 24, No. 6, pages 1517–1522 Dec. 1989. While one LSB Driver is being used to drive the lower segment divider, the other will have the average current copied into it. The LSB Drivers are periodically interchanged and the process repeated indefinitely throughout the normal operation of the DAC. This provides for both continuous correction of the gain mismatch to compensate for temperature drift and aging, as well as refresh of the storage nodes typically associated with current copying schemes.

The key point is that the LSB Drivers are switched infrequently, i.e., only every several clock cycles. This means that the time constant referred to in FIGS. 3 and 4, associated with switching the location of the lower segment divider, is much less problematic, since it shows up only as very low frequency tones in the spectral response. The tone frequency is related to the frequency used to switch between the LSB drivers 630 and 640. If, for example, the LSB drivers 630 and 640 are switched every few milliseconds, the tone frequency will be in the region of hundreds of hertz. Generally this is not a problem for Nyquist rate applications where the bandwidth of interest extends to several megahertz, and the presence of localized tones in a small portion of this bandwidth is tolerable.

If the low frequency tones referred to are problematic, the circuit of FIG. 6 may be modified to include two lower segment dividers, each permanently associated with one of the LSB Drivers 630 and 640. This obviates the need for the multiplexing switch bank 800, and removing these switches ensures that the long time constant node is not significantly disturbed when alternating between LSB drivers. Therefore, the low frequency tones are much attenuated at the expense of some additional area for implementing the extra lower segment divider.

The embodiments described above provide a means to construct segmented high speed and precision DACs in such a way as to ensure static linearity and dynamic linearity as follows. In the preferred embodiment, DEM is applied to an entire segmented DAC. The lower segments are integrated in the DEM scheme. So all segments including the lower ones are matched both statically and dynamically. In the alternative embodiment, DEM is applied to all the upper segments, so these are once again matched both statically and dynamically. The lower segments are matched in sum to the upper segments statically. This is done by using a circuit which measures the average current of the DEM-matched upper segments and copies it into the lower segments. The preferred embodiment integrates the lower segments into the DEM scheme of the entire DAC, thus making DEM feasible in a segmented environment. This is done by the use of the required randomizing circuitry and divider location switching circuitry. The alternative embodiment is a hybrid combination of DEM with current-measurement and copying schemes. This is done by means of the required randomizing circuitry, average circuit selection circuitry, average measurement circuitry, and current copying circuitry. The alternative embodiment can be readily modified to make yet another embodiment in which an additional divider circuit is used to avoid the presence of low frequency tones in the output spectral response.

The preferred embodiment provides a means to attain not only static matching of DAC unit elements, but also dynamic matching. This is done through the use of DEM over the entire DAC including the lower segments. The alternative embodiment provides a means to attain both static and dynamic matching of the DAC upper segment unit elements, as well as static matching between the upper segments and the sum of the lower segments. This is done through the use of DEM over the upper segments and current measurement and correction from the upper segments to the lower ones. The alternative embodiment provides a solution to the problem encountered when switching the lower segment divider at high frequency as required in the preferred embodiment. The alternative embodiment can be modified to even avoid any low frequency tones resulting from the calibration process. The embodiments may additionally be modified to include static calibration of all the MSB current sources (including the dedicated LSB drivers in the alternative embodiment). This matches all current sources statically and is also beneficial in reducing the noise introduced by the DEM. Typically the averaging circuit is easier to design if the MSB values are closer to begin with. The embodiments described are mainly dependent on DEM, and the DEM circuitry accounts for most of the additional circuitry required in both schemes. Therefore, they may be easily applied to existing DAC analog cores since only additional digital logic is required. Digital logic is cheap in modern CMOS and BiCMOS processes.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A segmented digital-to-analog converter comprising:
   upper segments;
   a thermometer decoder;
   a randomizing circuit coupled between the thermometer decoder and the upper segments for randomizing an output of the thermometer decoder;
   a divider location selector circuit coupled between the randomizing circuit and the upper segments for choosing a selected segment from the upper segments; and
   lower segments coupled to the selected segment.

2. The device of claim 1 wherein the upper segments comprise current sources.

3. The device of claim 1 wherein the lower segments comprise current sources.

4. The device of claim 1 wherein the selected segment is randomly selected from the upper segments.

5. The device of claim 1 wherein the selected segment is deterministically selected from the upper segments.

6. The device of claim 1 wherein the upper segments comprise $2^N$ segments for an N bit digital input.

7. A segmented digital-to-analog converter comprising:

upper segments;

a thermometer decoder;

a randomizing circuit coupled between the thermometer decoder and the upper segments for randomizing outputs of the thermometer decoder;

an averaging circuit coupled to the upper segments for providing an averaged signal from the upper segments; and lower segments coupled to the averaged signal.

8. The device of claim 7 wherein the upper segments comprise current sources.

9. The device of claim 7 wherein the lower segments comprise current sources.

10. The device of claim 7 wherein the upper segments include two drivers that are coupled to the averaged signal one at a time.

11. The device of claim 7 wherein the upper segments comprise $2^N$ segments for an N bit digital input.

12. A method for segmented digital-to-analog conversion comprising:

providing upper segments;

providing a thermometer code vector from a digital input word;

randomizing the thermometer code vector;

controlling the upper segments with the randomized thermometer code vector;

choosing a selected segment from the upper segments;

providing lower segments; and coupling the lower segments to the selected segment.

* * * * *